(12) United States Patent
Akimoto et al.

(10) Patent No.: US 9,082,901 B2
(45) Date of Patent: Jul. 14, 2015

(54) SOLAR CELL AND MANUFACTURING METHOD OF THE SAME

(71) Applicant: E I DU PONT DE NEMOURS AND COMPANY, Wilmington, DE (US)

(72) Inventors: Hideki Akimoto, Kanagawa (JP); Chieko Kikuchi, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 13/795,191

(22) Filed: Mar. 12, 2013

(65) Prior Publication Data

US 2013/0273687 A1 Oct. 17, 2013

Related U.S. Application Data

(60) Provisional application No. 61/622,729, filed on Apr. 11, 2012.

(51) Int. Cl.
*H01L 21/00* (2006.01)
*H01L 31/0224* (2006.01)
*H01L 31/068* (2012.01)

(52) U.S. Cl.
CPC .... *H01L 31/022441* (2013.01); *H01L 31/0682* (2013.01); *Y02E 10/547* (2013.01)

(58) Field of Classification Search
CPC .................. H01L 31/022425; Y01E 10/50
See application file for complete search history.

(56) References Cited

U.S. PATENT DOCUMENTS

| 7,718,092 | B2 | 5/2010 | Rose et al. |
| 7,771,623 | B2 | 8/2010 | Young et al. |
| 8,338,690 | B2 * | 12/2012 | Murozono et al. ............. 136/243 |
| 2009/0301557 | A1 | 12/2009 | Agostinelli et al. |
| 2010/0170562 | A1 | 7/2010 | Akimoto |
| 2011/0014743 | A1 | 1/2011 | Young et al. |
| 2011/0143486 | A1 | 6/2011 | Hama et al. |
| 2012/0048376 | A1 * | 3/2012 | Gilman .......................... 136/261 |
| 2012/0318559 | A1 * | 12/2012 | Aoyagi et al. .............. 174/126.2 |
| 2014/0000675 | A1 * | 1/2014 | Komoda et al. ............... 136/244 |

FOREIGN PATENT DOCUMENTS

WO 2009/032429 A1 3/2009

OTHER PUBLICATIONS

U.S. Appl. No. 14/048,182, Non-Final Office Action dated Jan. 15, 2015.

* cited by examiner

*Primary Examiner* — Zandra Smith
*Assistant Examiner* — Andre' C Stevenson

(57) ABSTRACT

A method for manufacturing a solar cell, comprising steps of: a) providing a semiconductor substrate having a light-receiving side and a back side, wherein a passivation layer is formed on the back side; b) forming a silver conductor pattern on the back side of the semiconductor substrate; c) forming an aluminum conductor pattern on the back side of the semiconductor substrate, at least part of the aluminum conductor pattern being superimposed on at least part of the silver conductor pattern; and d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed.

10 Claims, 3 Drawing Sheets

SOLAR CELL AND MANUFACTURING METHOD OF THE SAME

FIELD OF THE INVENTION

The present invention relates to a solar cell and a manufacturing method of the same.

TECHNICAL BACKGROUND OF THE INVENTION

Solar cells having a passivation layer on the back side surface of a semiconductor layer typically have a back side electrode that passes through the passivation layer to be in electric contact with the semiconductor layer.

US20090301557 discloses a method for the production of a Passivatived Emitter and Rear Cell (PERC) solar cell which has a passivation layer on the back side. The back side electrode is formed on the passivation layer having holes so that it can contact with the semiconductor.

WO2009/032429 discloses a method of making a PERC solar cell. The back side electrode is partially formed on the passivation layer on the back side by screen printing and firing an aluminum paste containing another metal such as silver, copper, nickel, which is capable of firing through the passivation layer.

SUMMARY OF THE INVENTION

An objective is to provide a method of manufacturing a solar cell back side electrode by using a silver paste and an aluminum paste.

One aspect relates to a method for manufacturing a solar cell, comprising steps of: a) providing a semiconductor substrate having a light-receiving side and a back side, wherein a passivation layer is formed on the back side; b) forming a silver conductor pattern comprising silver-containing powder in a prescribed pattern on the back side of the semiconductor substrate; c) forming an aluminum conductor pattern comprising aluminum powder in a prescribed pattern on the back side of the semiconductor substrate, at least part of the aluminum conductor pattern being superimposed on at least part of the silver conductor pattern; and d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed, wherein the electric contact by way of the fire through is not formed in a region where the silver conductor pattern and the aluminum conductor pattern are not superimposed.

Another aspect relates to a method for manufacturing a solar cell, comprising steps of: a) providing a semiconductor substrate having a light-receiving side and a back side, wherein a passivation layer is formed on the back side; b) forming an aluminum conductor pattern comprising an aluminum powder in a prescribed pattern on the back side of the semiconductor substrate; c) forming a silver conductor pattern comprising a silver-containing powder in a prescribed pattern on the back side of the semiconductor substrate, at least part of the silver conductor pattern being superimposed on at least part of the aluminum conductor pattern; and d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed, wherein the electric contact by way of the fire through is not formed in a region where the silver conductor pattern and the aluminum conductor pattern are not superimposed.

Another aspect relates to a method for manufacturing a solar cell, comprising steps of: a) providing a semiconductor substrate having a light-receiving side and a back side, wherein a passivation layer is formed on the back side; b) applying a first conductive paste comprising silver-containing powder in a prescribed pattern on the back side of the semiconductor substrate, thereby forming a silver conductor pattern; c) applying a second conductive paste comprising aluminum powder in a prescribed pattern on the back side of the semiconductor substrate, thereby forming an aluminum conductor pattern, at least part of the aluminum conductor pattern being superimposed on at least part of the silver conductor pattern; and d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed, wherein the electric contact by way of the fire through is not formed in a region where the silver conductor pattern and the aluminum conductor pattern are not superimposed.

Another aspect relates to a method for manufacturing a solar cell, comprising steps of: a) providing a semiconductor substrate having a light-receiving side and a back side, wherein a passivation layer is formed on the back side; b) applying a second conductive paste comprising an aluminum powder in a prescribed pattern on the back side of the semiconductor substrate, thereby forming an aluminum conductor pattern; c) applying a first conductive paste comprising a silver-containing powder in a prescribed pattern on the back side of the semiconductor substrate, thereby forming an aluminum conductor pattern, at least part of the silver conductor pattern being superimposed on at least part of the aluminum conductor pattern; and d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed, wherein the electric contact by way of the fire through is not formed in a region where the silver conductor pattern and the aluminum conductor pattern are not superimposed.

A solar cell formed by the present invention can have a superior electrical property.

DETAILED DESCRIPTION OF THE INVENTION

The method for manufacturing a solar cell comprises steps of a) providing a semiconductor substrate, b) forming a silver (Ag) conductor pattern, c) forming an aluminum (Al) conductor pattern, and d) firing the Ag conductor pattern and the Al conductor pattern at the same time.

The Ag conductor pattern is formed by applying an Ag paste in an embodiment. The Ag conductor pattern is formed by vapor deposition of Ag containing powder in another embodiment.

The Al conductor pattern is formed by applying an Al paste in an embodiment. The Al conductor pattern is formed by vapor deposited Al in another embodiment.

A method of manufacturing a solar cell is explained below, referring to FIGS. 1A to 1D as the embodiment of using pastes.

Figure 1A:
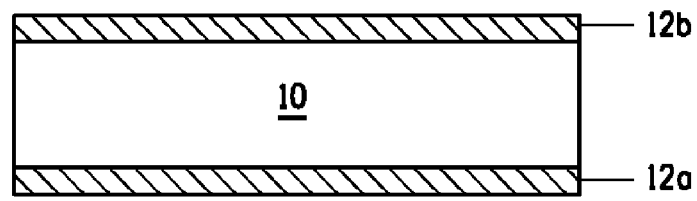
FIGS. 1A to 1D explain the process of manufacturing a solar cell.

A semiconductor substrate 10 is prepared (FIG. 1A). A passivation layer 12a and another passivation layer 12b are formed entirely on the back side and the light-receiving side of the semiconductor substrate 10 respectively. The PERC solar cell is characterized by the passivation layer 12a on the back side that can reduce the recombination of holes and electrons near the back side surface. Although the passivation layer 12b on the light-receiving side of the semiconductor layer 10 is not essential in the present invention, it can function as an anti-reflective coating (ARC) as well as the passivation layer.

The semiconductor substrate 10 can be a p-doped silicon wafer and an n-type diffusion layer is formed on the light-receiving side of the semiconductor substrate 10 in an embodiment. The p-doped silicon wafer can be doped with boron.

The passivation layer 12a and 12b can be formed with titanium oxide, aluminum oxide, silicon nitride, silicon oxide, indium tin oxide, zinc oxide or silicon carbide.

These oxides, nitrides and carbide can be applied by sputtering, plasma-enhanced chemical vapor deposition (PECVD), or a thermal CVD or plasma CVD. A multiple layer can be also available, for example, two layers of silicon nitride/silicon oxide or silicon nitride/aluminum oxide as the passivation layer 12a and 12b. The thickness of the passivation layer 12a and 12b can be 10 to 500 nm.

In the specification, "light-receiving side" is the side that faces the sun to receive the sunlight when the solar cell is actually installed to generate electricity, and "back side" is the opposite side of the light-receiving side.

Figure 1B:
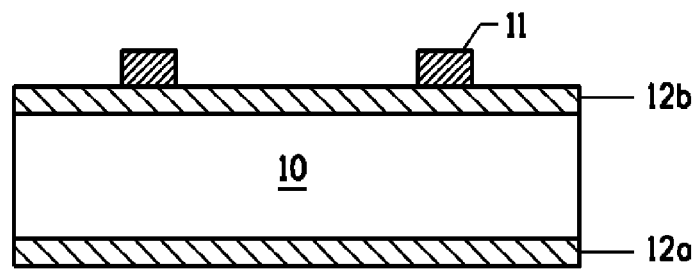

On the light-receiving side, a front electrode paste 11 that often contains silver powder can be applied by screen-printing onto the passivation layer 12b (FIG. 1B). The front electrode paste 11 can contain essentially silver powder and a glass frit dispersed into an organic medium.

On the back side, an Ag conductor pattern comprising silver-containing powder is formed in a prescribed pattern on the back side of the semiconductor substrate.

Figure 2A:
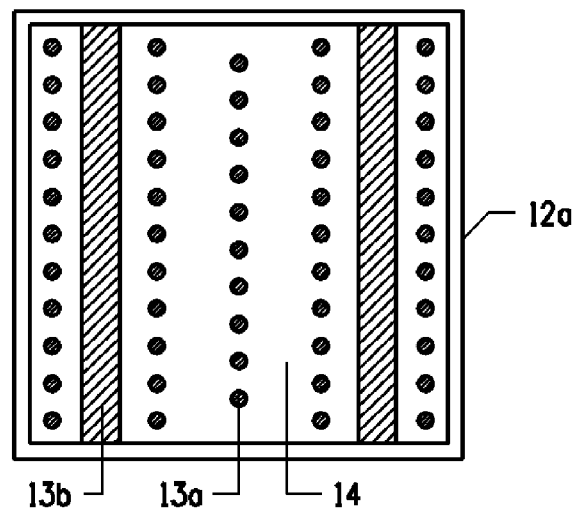
FIG. 2 (a), (b), and (c) are rear view drawings of the Ag conductor pattern and the Al conductor pattern on the back side.
Figure 2B:
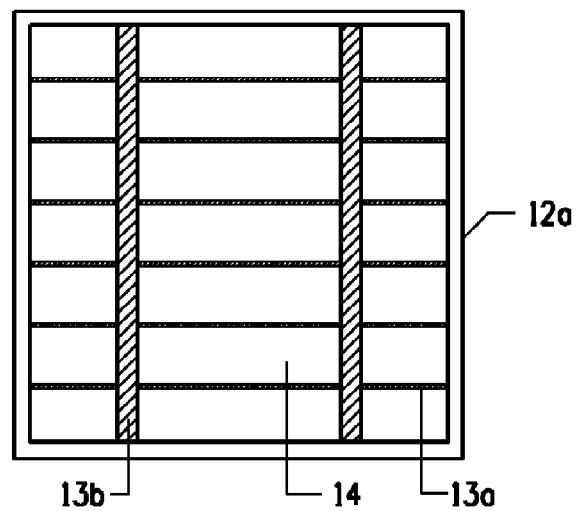
Figure 2C:
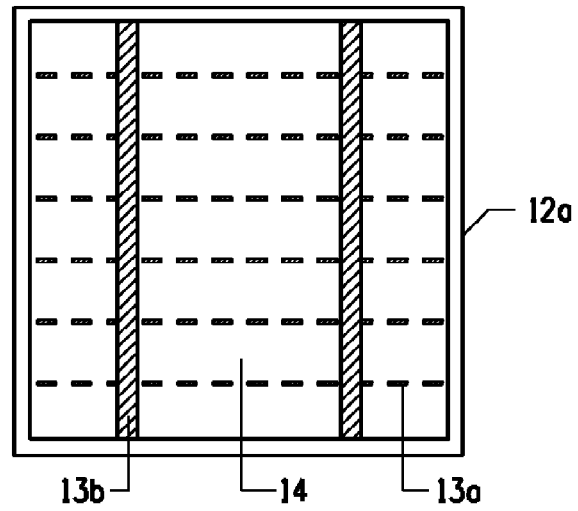

A first conductive paste comprising silver (Ag)-containing powder is applied, for example by screen printing, onto the passivation layer 12a on the back side of the semiconductor substrate 10 in a prescribed pattern to form the Ag conductor pattern 13 in an embodiment. The silver conductor pattern 13, for example, comprises dots with a round shape 13a and straight lines 13b as illustrated in FIG. 2 (a). The diameter of the dots can be 10 to 400 μm in an embodiment. The pitch between the centers of the dots can be 20 μm to 30 mm in an embodiment. The diameter of the dot and spacing between dots can be measured by SEM for example. Other examples of the prescribed pattern of the silver conductor pattern 13 are described later.

A silver conductor pattern comprising silver-containing powder is formed in a prescribed pattern on the back side of the semiconductor substrate.

Figure 1C:
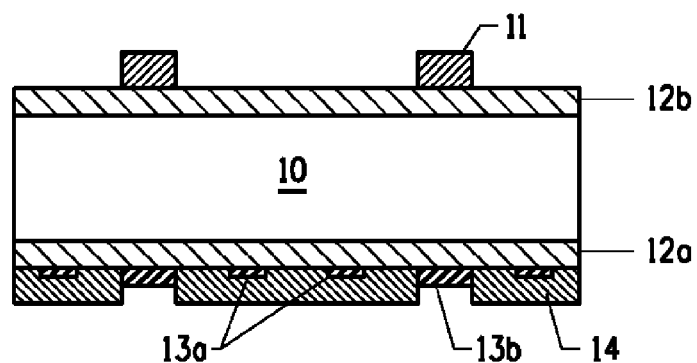
Figure 1D:
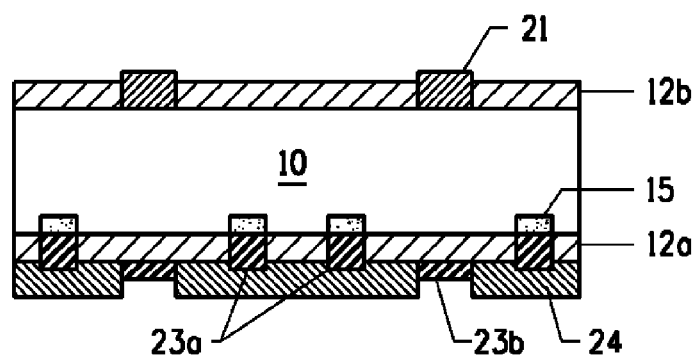

For example, a second conductive paste comprising at least an aluminum powder is applied onto the passivation layer 12a in a prescribed pattern to form an Al conductor pattern 14 as illustrated in FIG. 1C. The way of applying the Al paste can be screen printing, nozzle discharge, or off-set printing.

The prescribed pattern of the Al conductor pattern is not particularly limited.

In an embodiment, the second conductive paste 14 can be applied in a prescribed pattern such that part of the silver conductor pattern 13a is superimposed with the Al conductor pattern 14 and the rest of the silver conductor pattern 13b is not superimposed with the Al conductor pattern 14. In the illustrated embodiment in FIG. 1C, the second conductive paste is applied onto the passivation layer 12a so as to cover the dotted Ag conductor pattern 13a, and the line Ag conductor pattern 13b remains uncovered with the second conductive paste 14. Other examples of the prescribed pattern of the Al pattern 14 are described afterwards.

The Ag conductor pattern 13 and the Al conductor pattern 14 can be dried at 80 to 200° C. in an oven for 1 to 20 minutes. The drying step is not essential.

The Ag conductor pattern 13 and the Al conductor pattern 14 are fired at the same time.

The firing is carried out, for example in a furnace. The firing condition can be with peak setting temperature of 600 to 1000° C. for 1 second to 15 minutes in an embodiment. The firing condition can be from 400 to 600° C. for 5 seconds to 23 minutes, and over 600° C. for 3 seconds to 19 minutes. Total firing time can be 10 seconds to 30 minutes in an embodiment, 20 seconds to 15 minutes in another embodiment, 30 seconds to 5 minutes in another embodiment. When firing in such conditions, the electrodes can be formed with less damage to the semiconductor substrate. The firing time can be counted, for example, from entrance to exit of the furnace.

The Ag conductor pattern 23 after firing and the Al conductor pattern after firing 24 can be 1 to 100 μm thick in an embodiment. The Al conductor pattern after firing 24, which can be called Al electrode, can be 1 to 100 μm thick in an embodiment.

During the firing, an electric contact between the semiconductor substrate 10 and the Al conductor pattern after firing 24 is formed by way of fire through in a region where the Ag conductor pattern 13a and the Al conductor pattern 14 are superimposed. The electric contact between the semiconductor substrate 10 and the Al conductor pattern after firing 24 is not formed by way of the fire through in a region where the silver conductor pattern 13b and the second conductive paste 14 are not superimposed.

The scope of the invention is not limited by theories, but it is assumed that the fire-through could occur because silver in the Ag conductor pattern 13a and aluminum in the Al conductor pattern 14 disperse into the passivation layer 12a and penetrate the passivation layer 12a to reach the semiconductor substrate 10, which is called "fire-through", in a region where silver and aluminum co-exist. Consequently, the Al conductor pattern after firing 24 can have an electrical connection with the semiconductor substrate 10 whilst the most of the passivation layer 12a remains to sufficiently contribute to the passivation.

The aluminum dispersed from the Al conductor pattern 14 to reach the semiconductor substrate 10 can form Si-Al alloy layer and back surface field (BSF) 15 that can improve an electrical property of a solar cell.

The area of the region where the Ag conductor pattern 13a and the Al conductor pattern 14 are superimposed can be at least 0.001% in an embodiment, at least 0.01% in another embodiment, at least 0.1% in another embodiment, and at least 1% in still another embodiment, based on the back surface area of the semiconductor substrate 10. The area of the region where the Ag conductor pattern 13a and Al conductor pattern 14 are superimposed can be 50% or less in an embodiment, 30% or less in another embodiment, and 15% or less in still another embodiment, based on the back surface area of the semiconductor substrate 10.

The passivation layer 12*a* beneath the area where the silver conductor pattern 13*a* and the Al conductor pattern 14 are superimposed is fired through. The passivation layer 12*a* adjacent to the area of the double layer of the Ag conductor pattern 13*a* and the Al conductor pattern 14 may show fire-through to some extent, because Ag could disperse out over the area of the double layer. The fire-through area can be also smaller than the area of the double layer, if just small amount of Ag disperses.

At least part of the rest of the silver conductor pattern can function as a tab electrode on the back side of the semiconductor substrate after firing in an embodiment. For example, the rest of the Ag conductor pattern 13*b* that is not superimposed with the Al conductor pattern 14 can become a tab electrode 23*b* after firing. The passivation layer 12*a* can remain underneath the tab electrode 23*b* that is not superimposed with the Al conductor pattern after firing 24. When simultaneously forming the tab electrode 23*b* and the Ag conductor pattern 23*a* by using the first conductive paste on the passivation layer 12*a* as the above embodiment, the process can be simple.

The tab electrode 23*b* is not an integral component for a solar cell. It is formed when the cell needs to be connected to another by soldering a ribbon. The tab electrode 23*b* typically contains silver because it is solderable while aluminum is not. In an embodiment, the first conductive paste contains no aluminum or a small amount of aluminum, for example, less than 0.3 wt %, 1.0wt %, 3.0wt % based on the weight of the first conductive paste, to render enough solderability to the resulting tab electrode 23*b*.

The second conductive paste 14 does not fire though the passivation layer by itself. Therefore, it is possible to apply the second conductive paste entirely onto the passivation layer 12*a* to form the Al conductor pattern after firing 24 having low resistivity, in an embodiment. In the embodiment where the fire-through can occur by the combination of silver and aluminum, the second conductive paste contains no silver. However, it is acceptable to contain silver in a contamination level, for example 0.1 wt % or less of the second conductive paste.

Although neither the first conductive paste nor the second conductive paste is capable of firing through the passivation layer 12*a* by itself, it does not mean to exclude a certain level of penetration. The small amount of penetration can occur as a result of various factors such as materials of the semiconductor layer 10; materials of the passivation layer 12*a*; and the contamination in the passivation layer or the conductive pastes. It is acceptable that the passivation layer 12*a* is partially penetrated or gets thinner in the region where the pastes are not superimposed, as long as it remains enough to contribute to the passivation on the back side.

The passivation layer 12*a* remains at least 49% of the back surface area of the semiconductor substrate.

The front electrode paste 11 on the light-receiving side can be fired to form a front electrode 21 together with the pastes on the back side. The conductive pastes 13 and 14 on the back side and the front electrode paste 11 on the light-receiving side can be fired at the same time, which is called co-firing. With co-firing, the overall process of manufacturing solar cells can be shorter and simpler, resulting in the reduction of production cost.

Alternatively, the conductive pastes on the back side and the front electrode paste can be fired separately, for example by applying and firing the conductive pastes on the back side first, and then applying and firing the front electrode paste with different firing conditions, especially when suitable firing conditions for the pastes are not overlapping.

Although the pattern consists of the dots in a round shape 13*a* and the straight lines 13*b* as illustrated in FIG. 2 (*a*) in the explanation above, the Ag conductor pattern 13 is not limited.

The straight lines 13*b* that can function as tab electrodes can be 500 to 5000 μm wide. The tab electrode can lie one to three on the back side of the semiconductor substrate in another embodiment.

In another embodiment, the Ag conductor pattern 13 can comprise lines 13*a* as illustrated in FIG. 2 (*b*). In another embodiment, the other line 13*b* to be the tab electrode 23*b* can be included in the conductor pattern 13 where the lines 13*a* cross the other lines 13*b*. The lines 13*a* can be 10 to 2000 μm wide. The other lines 13*b* that could be the tab electrodes can be 500 to 5000 μm wide as well.

In another embodiment, the Ag conductor pattern 13 can comprise dashed lines as illustrated in FIG. 2 (*c*). In another embodiment, the other line 13*b* to be the tab electrode 23*b* can be included in the conductor pattern where the dashed lines 13*a* cross the other lines 13*b*. The dashed lines 13*a* can be 10 to 2000 μm wide and 0.5 to 10 mm long. The other lines 13*b* to be the tab electrode can be 500 to 5000 μm wide as well.

As other examples, the Ag conductor pattern 13 can be circular lines or polygonal lines, although they are not illustrated in the figures.

Figure 3A:
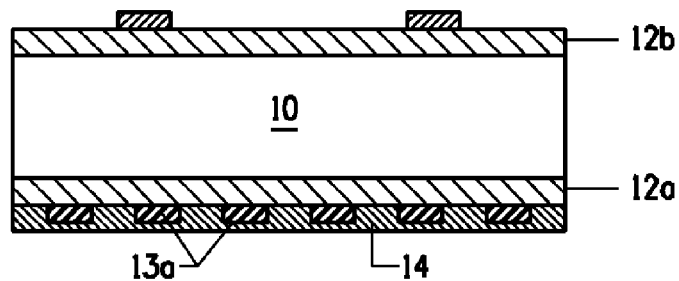
FIG. 3 (a), (b), and (c) are cross-section drawings of the Ag conductor pattern and the Al conductor pattern on the back side.
Figure 3B:
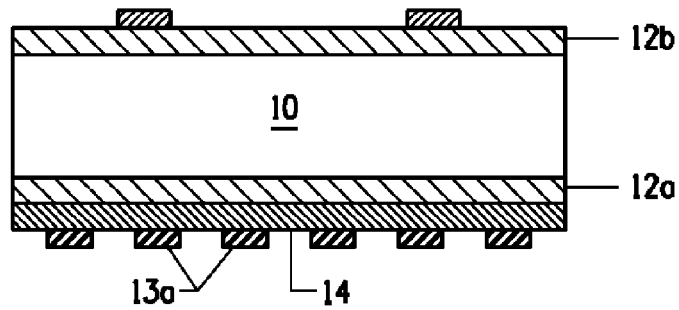
Figure 3C:
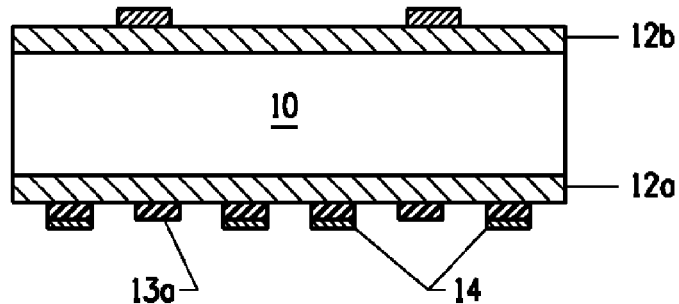

The Al conductor pattern 14 is not limited. Besides the embodiment already described above, the Al conductor pattern 14 can be entirely applied onto the passivation layer 12*a* to cover the entire Ag conductor pattern 13 as illustrated in FIG. 3 (*a*). The Al conductor pattern 14, can be formed on the entire surface of the passivation layer on the back side of the semiconductor substrate 10 consequently it can superiorly have low resistivity. A small mm width at the edge of the substrate 10 can remain without forming the Al conductor pattern 14. In this case, the tab electrode can be formed separately by applying a third conductive paste onto the Al conductor pattern 14.

In another embodiment, the Al conductor pattern 14 can be formed on the passivation layer 12*a* before forming the Ag conductor pattern 13. For example, the second conductive paste can be applied directly onto the passivation layer 12*a* before applying the first conductive paste to form the Ag conductor pattern 13. The second conductive paste is entirely applied onto the passivation layer 12*a* and the first conductive paste is applied on the Al conductor pattern 14 in an embodiment. The second conductive paste 14 exists between the passivation layer 12*a* and the Ag conductor pattern 13*a* as illustrated in FIG. 3 (*b*).

In another embodiment, the second conductive paste 14 is partially applied in order to make a space for forming, for example, the tab electrode. The tab electrode can be formed by applying a conductive paste to the space formed when applying the second conductive paste. The conductive paste for forming the tab electrode in the space can be the same as the first conductive paste or be modified from a viewpoint of electric properties.

In another embodiment, the second conductive paste can be applied onto part of the Ag conductor pattern 13*a* that is previously made by partially applying the first conductive paste on the passivation layer 12*a* as illustrated in FIG. 3 (*c*). The opposite version where the Ag conductor pattern can be partially formed onto the partially-formed Al conductor pattern can be also available (not shown).

In another embodiment, the Ag conductor pattern 13 and the Al conductor pattern 14 on the back side can be formed by vapor deposition with Ag and Al respectively. The vapor deposition can be physical vapor deposition (PVD) or chemical vapor deposition (CVD) in another embodiment. A mask having open area of a prescribed pattern for the Ag conductor pattern or the Al conductor pattern is used at the deposition of the metals such as Ag and Al on the passivation layer.

In the PVD, the metal such as Ag and Al is vaporized by thermal energy or plasma energy and then deposited on the passivation layer 12a on the back side of the semiconductor substrate 10 through the mask having the prescribed pattern to form the Ag pattern 13 in referring FIG. 1C. Sputtering can be available as the PVD in an embodiment. In sputtering, for example direct current high voltage is applied between the semiconductor substrate 10 and the metal such as Ag and Al as a target in a vacuum chamber in which inert gas such as argon gas is installed. The target is deposited on the passivation layer 12a by being attacked by the ionized argon.

The CVD is an atmosphere controlled process by utilizing thermal energy, photo-energy or radiate energy in a CVD reactor to deposit the metal such as Ag and Al on the passivation layer 12a to form the patterns 13 and 14 as the result of reactions between various gaseous phases and the heated surface of substrates. The CVD can be Plasma-enhanced CVD, Thermal CVD, or Photo-excited CVD.

The present invention explained above by the example of PERC solar cell. The present invention can be also used to form a back contact type-solar cell which comprises a semiconductor substrate having a passivation layer on the back side and the light-receiving side and a back side electrode only on the back side of the semiconductor substrate. US20100170562 can be herein incorporated by reference for the back contact type-solar cell.

The first conductive paste and the second conductive paste are explained in detail below.

First Conductive Paste

The first conductive paste comprises at least a silver-containing powder and an organic medium. The Ag-containing powder is dispersed into the organic medium by, for example, mechanical mixing to form viscous compositions called "pastes", having suitable consistency and rheology for coating or printing.

The Ag-containing powder is selected from the group consisting of Ag powder, Ag alloy powder, Ag-coating powder, Ag powder coated with another metal and the mixture thereof in an embodiment; Ag powder, Ag-alloy powder, and the mixture thereof in another embodiment.

The Ag powder is a metal powder with Ag purity of 95% or more in an embodiment. The Ag powder with, for example, 99% purity is available in the market.

The Ag alloy powder is an alloy powder containing Ag and other metal, for example, Ag—Cu alloy powder, Ag—Ni alloy powder, Ag—Al alloy powder.

The Ag-coating powder is a metal powder coated with silver, for example, Cu powder coated with Ag, Ni powder coated with Ag, Al powder coated with Ag.

The Ag powder coated with another metal is a silver powder coated with another metal, for example, Ag powder coated with Cu, Ag powder coated with Ni, Ag powder coated with Al.

The Ag-containing powder can be at least 0.1 weight percent (wt %) in an embodiment, at least 3 wt % in another embodiment, at least 8 wt % in another embodiment, at least 12 wt % in another embodiment, at least 25 wt % in another embodiment, and at least 38 wt % in still another embodiment, based on the weight of the first conductive paste. The Ag-containing powder can be 95 wt % or less in an embodiment, 88 wt % or less in another embodiment, and 79 wt % or less in another embodiment, 70 wt % or less in another embodiment, and 55 wt % or less in still another embodiment, based on the weight of the Ag paste. Containing such amount of the Ag-containing powder, the passivation layer can be effectively fired through by the combination of aluminum in the Al conductor pattern.

The Ag-containing powder can be any shape, for example flaked or spherical or nodular or a mixture of these.

There is no restriction on a particle diameter of the Ag-containing powder. However, the particle diameter can affect the sintering characteristics of the Ag-containing powder, for example, the larger particles sinter more slowly than the smaller particles. The particle diameter can be 0.01 to 10 μm in an embodiment, 0.05 to 8 μm in another embodiment, 0.1 to 5 μm in another embodiment. It is possible to mix two or more types of conductive powder of different diameters.

The particle diameter is obtained by measuring the distribution of the particle diameters by using a laser diffraction scattering method. The median ($50^{th}$ percentile) of the particle size distributions measured by volume is defined as D50. Microtrac model X-100 is an example of the commercially-available devices for this measurement.

In an embodiment, the first conductive paste can further comprise an additional metal powder besides the Ag-containing powder in order to increase an electrical property of the solar cell or reduce material cost. For example, a powder of nickel (Ni), copper (Cu), gold (Au), molybdenum (Mo), aluminum (Al), magnesium (Mg), tungsten (W), and palladium (Pd) can be added to the first conductive paste.

When adding, the additional metal powder can be 0.1 to 50 wt % in an embodiment, 1 to 30 wt % in another embodiment, 2 to 23 wt % in another embodiment, 5 to 10 wt % in still another embodiment, based on the weight of the first conductive paste.

In another embodiment, the first conductive paste can comprise no metal powder other than the Ag-containing powder.

The organic medium can be selected from wide variety of inert viscous materials in an embodiment. The organic medium can contain an organic polymer and optionally a solvent. There is no restriction on the organic medium which can be mostly removed by burning out or carbonized during firing. A wide variety of inert viscous materials can be used as an organic medium.

The organic medium can be an organic resin or a mixture of an organic resin and an organic solvent. Organic medium can be, for example, a pine oil solution or an ethylene glycol monobutyl ether monoacetate solution of polymethacrylate, or an ethylene glycol monobutyl ether monoacetate solution of ethyl cellulose, a terpineol solution of ethyl cellulose, or a texanol solution of ethyl cellulose. In an embodiment, organic medium can be a texanol solution of ethyl cellulose where the ethyl cellulose content is 5 wt % to 50 wt % based on the weight of the organic medium.

The organic medium can be 5 to 99.9 wt % in an embodiment, 12 to 91 wt % in another embodiment, 20 to 85 wt % in another embodiment, and 35 to 65 wt % in still another embodiment, based on the weight of the first conductive paste. The Ag-containing powder can be dispersed well with the amount of the organic medium.

The first conductive paste can further comprise a glass frit although it is not essential. The glass frit could increase adhesion of the silver conductor pattern to the substrate. When forming a tab electrode with the first conductive paste, the glass frit can be contained for the adhesion of the tab electrode.

An example of the glass frit that would not contribute to the firing through is a Pb—Si—Bi—Ti—O glass frit that contains 30 to 66 wt % of PbO, 11 to 33 wt % of $SiO_2$, 3 to 19 wt % of $Bi_2O_3$, 1 to 11 wt % of $TiO_2$ based on the weight of the glass frit. Another example of the lead-containing glass frit contains 53 to 57 wt % of PbO, 25 to 29 wt % of $SiO_2$, 2 to 6 wt % of $Al_2O_3$ and 6 to 9 wt % of $B_2O_3$ Another example is a lead-free glass frit that contains 40 to 73 wt % of $Bi_2O_3$, 11 to 33 wt % of $SiO_2$, 1 to 6 wt % of $Al_2O_3$ and 2 to 10 wt % of $B_2O_3$ based on the weight of the glass frit. The lead-free glass frit can further comprise alkali metal oxides such as $Na_2O$, alkaline earth metal oxides such as MgO and metal oxides $TiO_2$ and ZnO.

The softening point of the glass frit can be 300 to 600° C. since the conductive pastes is typically fired at 500 to 1000° C. When using a low softening point glass frit, the peak firing temperature can be set lower to result in less electronic damage to a semiconductor substrate. Softening point is determined by differential thermal analysis (DTA).

When adding, the glass frit can be 1 to 15 wt % in an embodiment, 3 to 7 wt % in another embodiment, based on the weight of the first conductive paste. When the glass frit content is in the range, the electrode can sufficiently adhere to the substrate.

The first conductive paste can further comprise any additive such as a metal oxide, thickener, stabilizer or surfactant according to a desired property.

Second Conductive Paste

The second conductive paste contains at least an aluminum (Al) powder and an organic medium. The Al powder is dispersed into the organic medium to form viscous compositions.

The Al powder can be a metal powder with Al purity of 90% or more in an embodiment, 95% or more in another embodiment.

The Al powder can be any shape, for example flaked or spherical or nodular or a mixture of these.

The Al powder can be 30 wt % or more in an embodiment, 40 wt % or more in another embodiment, 48 wt % or more in another embodiment, based on the weight of the second conductive paste. The Al powder can be 90 wt % or less in an embodiment, 82 wt % or less in another embodiment, 70 wt % or less in another embodiment based on the weight of the second conductive paste. The second conductive paste containing such amount of Al powder can contribute to the fire-through in combination of the first conductive paste as well as contribute to the sufficient electrical property as the aluminum electrode.

Particle diameter (D50) of the Al powder is not restricted. However, it can be 0.1 to 30 μm in an embodiment, 1 to 25 μm in another embodiment, and 2 to 20 μm in another embodiment. The Al powder with such particle diameter can be adequately dispersed in an organic medium and smoothly applied, for example screen printed. The particle diameter (D50) is obtained by the same measurement as the Ag-containing powder.

The organic medium in the second conductive paste is not restricted as well as the first conductive paste. The description about the organic medium for the first conductive paste can be referred here too. The organic medium can be 10 to 70 wt % of the second conductive paste.

In an embodiment, the second conductive paste can further comprise a glass frit. The glass frit can promote adhesion to the substrate.

Any type of glass frit can be available, such as lead borosilicate (Pb—B—Si—O) glass frit, zinc borosilicate (Zn—B—Si—O) glass frit, bismuth borosilicate (Bi—B—Si—O) glass frit, and lead silicate (Pb—Si—O) glass frit.

In an embodiment, softening point of the glass frit can be 300 to 650° C. since the conductive pastes is typically fired at 500 to 1000° C. When employing such softening point, the glass frit can properly melt to adhere the substrate during the firing.

The glass frit can be 0.1 to 10 wt % based on the weight of the second conductive paste in an embodiment.

The second conductive paste further comprises any additive such as a metal oxide thickener, stabilizer or surfactant according to a desired property.

For the second conductive paste, any purchasable aluminum paste to form a back-side electrode of a solar cell can be available. US20110014743, U.S. Pat. Nos. 7,718,092, and 7,771,623 can be herein incorporated by reference.

EXAMPLES

The present invention is illustrated by, but is not limited to, the following examples.

An Ag paste (PV51 M, E. I. DuPont de Nemours and Company) as the first conductive paste was screen-printed onto a passivation layer on the back surface of a p-doped silicon wafer. The silicon wafer had the n-type diffusion layer on its light-receiving side. The silver conductor pattern of the Ag paste consisted of dots of round shape with 100 μm diameter and 450 μm of pitch between the centers of the dots. The Ag paste was dried at 150° C. for 5 minutes.

The Al paste (PV35A, E. I. DuPont de Nemours and Company) as the second conductive paste was screen-printed onto the entire back-surface of the silicon wafer to cover the silver conductor pattern. The Al conductor pattern was dried at 150° C. for 5 minutes. The area where the Ag conductor pattern and the Al conductor pattern are superimposed was 4.4% based on the back surface area of the silicon wafer.

Another Ag paste (PV17F, E. I. DuPont de Nemours and Company) as the front electrode paste was screen-printed on the ARC on the light-receiving side in a pattern consisting of finger lines and a bus bar. The Ag paste was dried at 150° C. for 5 minutes.

A solar cell was obtained by firing the pastes in a furnace (CF-7210, Despatch industry) at peak temperature setting with 945° C. The furnace set temperature of 945° C. corresponded to a measured temperature at the upper surface of the passivation layer of 750° C. Firing time from furnace entrance to exit was 60 seconds. The firing condition was 400 to 600° C. for 12 seconds, and over 600° C. for 6 seconds. The belt speed of the furnace was 550 cpm.

Thickness of the Ag conductor pattern after firing was 4 μm in average. Thickness of the Al conductor pattern after firing was 30 μm in average.

As Comparative Example 1 and 2, other solar cells were obtained in the same manner of Example 1 except for applying only the Ag paste as the first conductive paste or applying only the Al paste as the second conductive paste respectively onto the back surface of the silicon wafer. Each of them was directly and entirely applied onto the passivation layer on the back surface of the silicon wafer and successively fired.

Conversion efficiency (Eff) was evaluated using a model NCT-M-150AA cell tester manufactured by NPC Corporation Result Efficiencies are shown in Table 1 below. The Eff was 15.23% in Example 1 where the Ag paste was partially applied and superimposed with the Al paste. Effs in Comparative Example 1 and 2 where either the Ag paste or the Al paste was applied was zero or 8.71% respectively.

TABLE 1

|  | Example 1 | Comparative Example 1 | Comparative Example 2 |
|---|---|---|---|
| Ag paste | Partially Applied | Entirely Applied | None |
| Al paste | Entirely Applied | None | Entirely Applied |
| Eff (%) | 15.2 | 0 | 8.7 |

Next, the amount of Ag containing powder in the first conductive paste was examined. Example 2 to 6 was carried out as described in Example 1 except for the first conductive paste composition, the second conductive paste composition and the Ag conductor pattern.

The Ag paste composition as the first conductive paste was shown in weight percent based on the weight of the Ag paste in Table 2 for each Example where the Ag powder amount was different respectively. The Al paste as the second conductive paste contained 72 wt % of Al powder, 1.5 wt % of glass frit, and 26.5 wt % of organic medium based on the weight of the Al paste was commonly used through Example 2 to 6. Neither the Ag paste nor the Al paste was capable of firing thought by itself.

The Ag conductor pattern was dots of quadrangular shape with 80 μm long and 60 μm wide, and 500 μm of pitch between the centers of the quadrangular dots. The area where the Ag conductor pattern and the Al conductor pattern were superimposed was 2.2% based on the back surface area of the silicon wafer.

The results of Example 2 to 6 show the preferably high value in Eff of the solar cell.

TABLE 2

|  |  | Example 2 | Example 3 | Example 4 | Example 5 | Example 6 |
|---|---|---|---|---|---|---|
| Ag paste (wt %) | Ag powder | 67.6 | 54.6 | 47.6 | 40.7 | 33.8 |
|  | Glass frit | 5.7 | 4.6 | 4.0 | 3.4 | 2.8 |
|  | Organic medium | 26.7 | 40.8 | 48.3 | 55.9 | 63.4 |
|  | Eff (%) | 18.6 | 18.6 | 18.8 | 18.9 | 18.1 |

What is claimed is:

1. A method for manufacturing a solar cell, comprising steps of:
    a) providing a semiconductor substrate having a light-receiving side and a back side, wherein a passivation layer is formed on the back side;
    b) applying a first conductive paste comprising silver-containing powder in a prescribed pattern on the passivation layer on the back side of the semiconductor substrate, thereby forming a silver conductor pattern;
    c) applying a second conductive paste comprising aluminum powder in a prescribed pattern on the passivation layer on the back side of the semiconductor substrate, thereby forming an aluminum conductor pattern, at least part of the aluminum conductor pattern being superimposed on at least part of the silver conductor pattern; and
    d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed,
    wherein the electric contact by way of the fire through is not formed in a region where the silver conductor pattern and the aluminum conductor pattern are not superimposed.

2. A method of claim 1, wherein the semiconductor substrate is a p-doped silicon wafer and wherein an n-type diffusion layer is formed on the light-receiving side of the semiconductor substrate.

3. A method of claim 1, wherein the passivation layer is formed with titanium oxide, aluminum oxide, silicon nitride, silicon oxide, indium tin oxide, zinc oxide or silicon carbide.

4. A method of claim 1, wherein the first conductive paste comprises 0.1 to 95 wt % of the silver-containing powder and 5 to 99.9 wt % of the organic medium based on the weight of the first conductive paste.

5. A method of claim 1, wherein the second conductive paste comprises 30 to 90 wt % of the aluminum powder and 10 to 70 wt % of the organic medium based on the weight of the second conductive paste.

6. A method of claim 1, wherein the first conductive paste and the second conductive paste are respectively screen printed onto the passivation layer on the back side of the semiconductor substrate.

7. A method of claim 1, wherein area of the region where the silver conductor pattern and the Al conductor pattern are superimposed is 0.001 to 50% based on the back surface area of the semiconductor substrate.

8. A method of claim 1, wherein the second conductive paste is applied in a pattern such that part of the silver conductor pattern is superimposed with the Al conductor pattern and the rest of the silver conductor pattern is not superimposed with the Al conductor pattern.

9. A method of claim 8, at least part of the rest of the silver conductor pattern functions as a tab electrode on the back side of the semiconductor substrate.

10. A method for manufacturing a solar cell, comprising steps of:
    a) providing a semiconductor substrate having a light-receiving side and a back side, wherein a passivation layer is formed on the back side;
    b) forming an aluminum conductor pattern comprising an aluminum powder in a prescribed pattern on the passivation layer on the back side of the semiconductor substrate;
    c) forming a silver conductor pattern comprising a silver-containing powder in a prescribed pattern on the passivation layer on the back side of the semiconductor substrate, at least part of the silver conductor pattern being superimposed on at least part of the aluminum conductor pattern; and
    d) firing the silver conductor pattern and the aluminum conductor pattern at the same time, thereby forming an electric contact between the semiconductor substrate and the aluminum conductor pattern by way of fire through in a region where the silver conductor pattern and the aluminum conductor pattern are superimposed,
    wherein the electric contact by way of the fire through is not formed in a region where the silver conductor pattern and the aluminum conductor pattern are not superimposed.

* * * * *